United States Patent [19]

Brown et al.

[11] 4,426,249

[45] Jan. 17, 1984

[54] COMPOSITION AND THICKNESS VARIATION IN DIELECTRIC LAYERS

[75] Inventors: Richard Brown, Berkeley Hts.; Phillip C. Jozwiak, Plainsboro, both of N.J.

[73] Assignee: RCA Corporation, New York, N.Y.

[21] Appl. No.: 509,785

[22] Filed: Jun. 30, 1983

[51] Int. Cl.³ .................... B44C 1/22; C03C 15/00; C03C 25/06; C23F 1/02
[52] U.S. Cl. .................... 156/653; 156/656; 156/657; 156/659.1; 156/661.1
[58] Field of Search ............. 156/653, 657, 654–656, 156/659.1, 661.1, 668, 662, 667; 29/580; 430/312, 313, 314, 316, 318, 317

[56] References Cited

U.S. PATENT DOCUMENTS

| | | | |
|---|---|---|---|
| Re. 29,947 | 3/1979 | Van Ommeren | 204/192 E |
| 4,184,909 | 1/1980 | Chang et al. | 156/657 |
| 4,289,834 | 9/1981 | Alcorn et al. | 428/601 |
| 4,307,179 | 12/1981 | Chang et al. | 430/314 |
| 4,376,287 | 3/1983 | Sechi | 357/80 |

Primary Examiner—William A. Powell
Attorney, Agent, or Firm—Birgit E. Morris; R. Hain Swope

[57] ABSTRACT

A method of precisely controlling the thickness of dielectric islands on a substrate is provided. The subject method comprises forming a patterned layer of an etchable metal over a first dielectric layer on a substrate, forming a second layer of dielectric material thereover so that there is contact where the etchable metal layer has been removed, patterning the second dielectric layer so that islands remain only over the openings in the etchable layer, removing the etchable metal layer and then patterning the first dielectric layer. There are thus provided islands of dielectric material on the substrate having a thickness equal to the first only or the first and second dielectric layers together, respectively. The process may be extended to form at least one additional layer of dielectric material on certain of the islands.

10 Claims, 7 Drawing Figures

APPLY DIELECTRIC TO METALLIZED SUBSTRATE

APPLY THIN, ETCHABLE METAL LAYER

APPLY AND DEVELOP RESIST

ETCH THIN, ETCHABLE LAYER EXPOSING DIELECTRIC

REMOVE REMAINING RESIST

APPLY SECOND DIELECTRIC LAYER

APPLY AND PATTERN RESIST LAYER OVER DOUBLE DIELECTRIC

ETCH DIELECTRIC DOWN TO ETCHABLE METAL LAYER

COMPOSITION AND THICKNESS VARIATION IN DIELECTRIC LAYERS

This invention relates generally to a method of controlling the makeup and size of dielectric layers formed on a substrate in connection with the formation thereon of single or multilevel circuitry.

BACKGROUND OF THE INVENTION

In certain applications such as the production of microwave power circuits, there is a need to precisely control the size, and on occasion, the makeup of "islands" of dielectric material on an active or passive substrate. Islands of varying size, i.e. thickness, on a single substrate are required to obtain variations in capacitance which is essential for certain devices, e.g. microwave power amplifiers.

The problem encountered in the fabrication of islands of dielectric material of varying thickness on a substrate is that, although dielectric material can be deposited with good control, it is very difficult to control the amount removed by etching. This holds true irrespective of the type of dielectric material utilized, how it is deposited and the method utilized to etch it. In accordance with this invention, there is provided a method of precisely forming islands of dielectric material of varying size and composition and, therefore, capacitance on a substrate.

SUMMARY OF THE INVENTION

Islands of dielectric material, varying in thickness and, if desired, composition are formed on a suitable substrate by a method comprising; coating the substrate with a first layer of dielectric material; depositing on the layer of dielectric material a patterned layer of an etchable metal; depositing thereover a second layer of the same or a different dielectric material, the two dielectric layers contacting where the etchable metal layer had been removed; selectively removing a portion of the second dielectric layer leaving those areas where the two dielectric layers are in contact; removing the etchable metal layer; and patterning the exposed first dielectric layer. There are thus-formed on the substrate islands of dielectric material having a thickness equal to that of the first dielectric layer and combined first and second dielectric layers, respectively.

DETAILED DESCRIPTION OF THE INVENTION

The substrate useful for the method of this invention may be any suitable material, for example, single crystalline silicon, gallium arsenide, polycrystalline materials with suitable surfaces, vitreous materials or the like. The substrate may contain regions of different conductivity types or of the same conductivity type but different resistance. Substrates utilized in the production of hybrid FET microwave power devices must be electrically insulating materials, with high thermal conductivity, preferably beryllium oxide. Since the surface of beryllium oxide typically contains cavities or voids, it is coated with a very thin planarizing layer of dielectric as disclosed in U.S. Pat. No. 4,376,287, issued, Mar. 8, 1983 the disclosure of which is incorporated herein by reference. The planarizing layer, must approximate the substrate in certain characteristics such as thermal expansion. For example, when the substrate is beryllium oxide, the planarizing layer is preferably a vitreous ceramic, although other materials such as certain polymers, i.e. polyimides, could be used as well.

Figure 1:
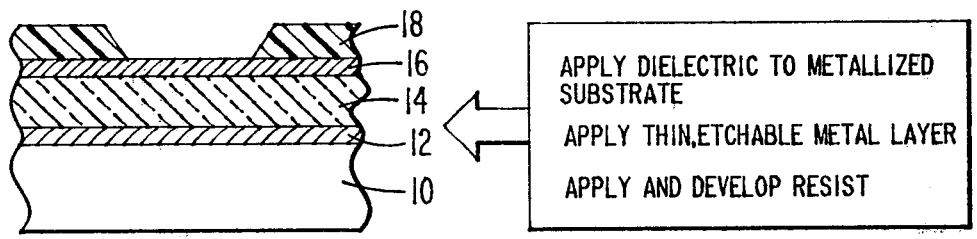
FIGS. 1–7 are elevational views in broken section illustrating the method of this invention.

The substrate depicted in FIG. 1 is comprised of a base layer 10 having thereover a layer of metal 12. When the base layer 10 is BeO, or other polycrystalline material, it would be coated, where desired, with the above-described planarizing layer, not shown. The metal layer 12 is a conductive metal, typically comprised of two or more sublayers of different metals, for example, a cermet-copper-palladium-gold material as described in the above-mentioned patent. Other metallizations which could be utilized to form layer 12 include titanium-tungsten-gold, molybdenum-gold, titanium-platinum-gold, titanium-platinum and the like. It is preferred that the metal layer 12 be comprised of a plurality of layers of different metals between certain metals such as copper or gold do not adhere well to such a ceramic material. The metal layer is deposited by conventional vapor deposition techniques such as sputtering, electron beam evaporation or electrodeposition.

A first layer of dielectric 14 is deposited over the metalized substrate. The dielectric material can be, for example, an inorganic material such as silicon dioxide, silicon nitride, a glass, e.g. a phosphosilicate glass, or the like, or an organic material such as a polyimide. A preferred dielectric material is silicon nitride. The dielectric layer 14 is formed over the metal layer 12 by conventional techniques such as chemical vapor deposition (CVD), low pressure chemical vapor deposition (LPCVD), sputtering and the like. It is preferred that the dielectric layer 14 be deposited by a relatively low temperature technique such as CVD.

The first layer of dielectric 14 is then coated with a thin layer of an etchable metal 16 such as copper, nickel, titanium and the like. This layer functions as an etch stop as will be described hereinafter. The etchable metal layer 16 must be removable by a wet or dry etching technique which will not appreciably etch dielectric layer 14. Etchable metal 16 must also be either impervious to etchants for the dielectric materials utilized in the subject method, or etch at a rate substantially slower than such materials thus being able to function as an etch stop for overlying dielectric materials. The use of these metal layers as etch stops is known. The etchable metal layer 16 is typically from about 20 to 500 nanometers (nm) thick, preferably from about 50 to 200 nm thick, and is deposited by conventional vapor deposition techniques such as, for example, evaporation.

A layer of resist material 18 is then formed over the etchable metal layer 16. The resist layer 18 is irradiated and developed, thus exposing a portion of etchable metal layer 16, as shown in FIG. 1. Any conventional resist material, e.g. photoresists, electron beam resists, X-ray resists and the like, can be utilized in the practice of this invention.

Figure 2:
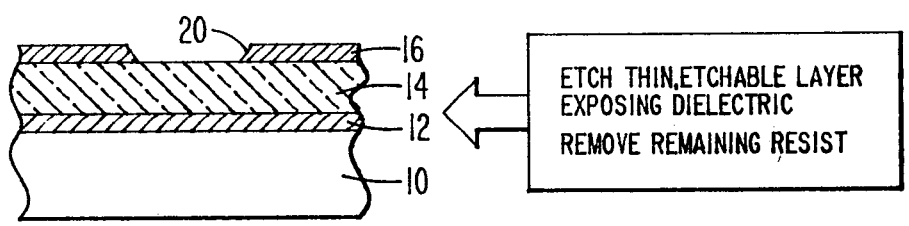

Utilizing the patterned layer of resist material 18 as a mask, the exposed portion of the thin, etchable metal layer 16 is then removed, forming an opening 20 to the first dielectric layer 14. The remaining resist is removed by conventional techniques, thus forming the structure shown in FIG. 2. Alternatively, the resist layer is allowed to remain and is utilized to remove the unwanted portion of the second dielectric layer by conventional lift-off techniques, not illustrated.

Figure 3:
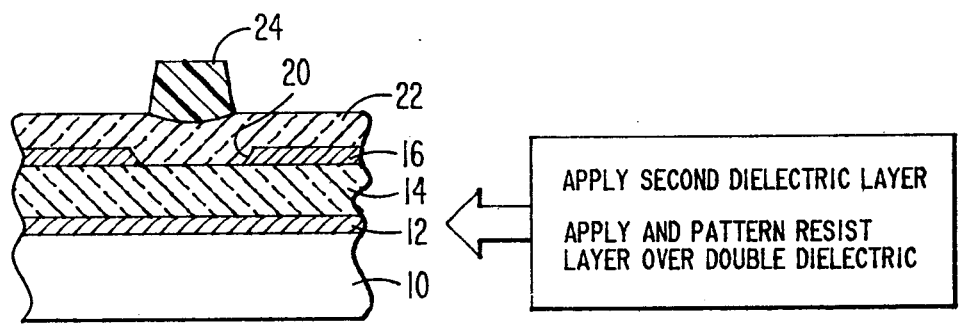

As shown in FIG. 3, a second layer of dielectric material 22 is deposited by conventional techniques over the etchable metal layer 16 and contacting first dielectric layer 14 through opening 20. While it is within the scope of the present invention that dielectric layers 14 and 20 can be of different material, it is preferred that they be the same. Generally, the second layer is from 20 to about 100 percent of the thickness of the first.

While this invention is described and illustrated with reference to two dielectric layers, it is within the scope thereof to add one or perhaps two additional dielectric layers to the structure. While a plurality of additional layers is possible, a total of three dielectric layers is considered to be a practical limit. The steps necessary to add an additional layer of dielectric material will be delineated hereinafter.

A resist layer 24 is then deposited over the second dielectric layer 22. The resist layer 24 is irradiated and developed thus exposing that portion of the second dielectric layer 22 which overlies the remaining etchable metal layer 16, as shown in FIG. 3.

Figure 4:
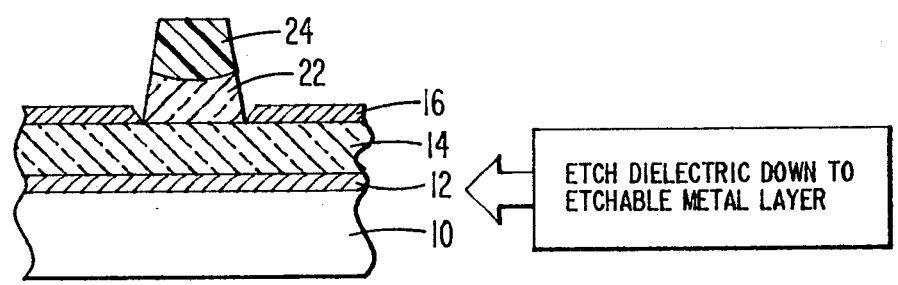
Figure 5:
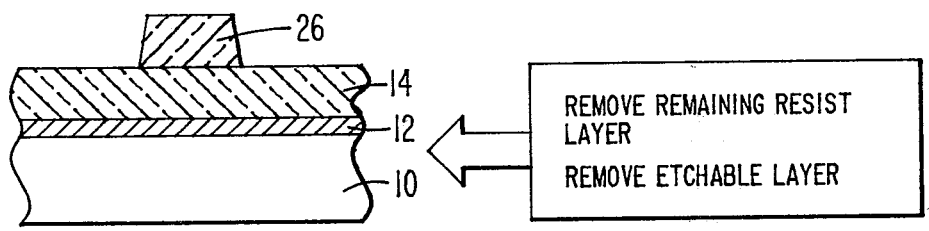

The portion of the second dielectric layer 22 exposed by development of the resist layer 24 is then removed, thus exposing the remaining portion of etchable metal layer 16 as shown in FIG. 4. The remaining portion of the resist layer 24 is conventionally removed. The remainder of the etchable metal layer 16 is also removed by applying a suitable etchant thereto, e.g. ferric chloride when the metal is copper. The substrate 10 is thus covered by a layer of dielectric material 14 on which an island 26 has been formed from the second dielectric layer 22 as shown in FIG. 5.

A third layer of dielectric, not illustrated, is added be depositing a second thin layer of etchable metal over the second dielectric layer 22. The second etchable metal layer is then pattern etched to form openings over one or more of the openings in the first etchable metal layer 16. A third dielectric layer is then deposited and patterned, a resist layer is formed thereon and patterned. The third dielectric layer is then etched in the manner illustrated in FIGS. 3 and 4. The second dielectric layer 22 is then selectively removed in the same manner, thus producing a structure such as shown in FIG. 5 with the exception that there will be islands of dielectric having the combined thickness of the second and third dielectric layers. The first dielectric layer 14 is then selectively removed as described herein. The structure can be extended to a forth dielectric layer by depositing a third thin etchable metal layer over the third dielectric layer and proceeding as above.

Figure 6:
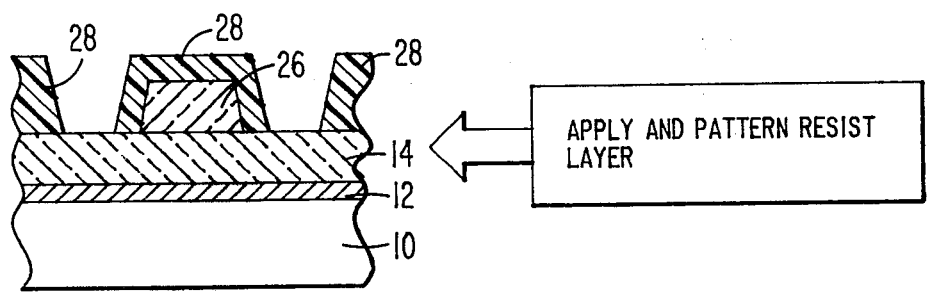

A layer of resist material 28 is applied to the substrate by conventional techniques. The etch rate of this resist vs. that of the first dielectric layer 14 must be such that the layer 14 can be effectively etched to the substrate without removing island 26. The resist layer 28 is irradiated and developed to produce the structure shown in FIG. 6.

Figure 7:
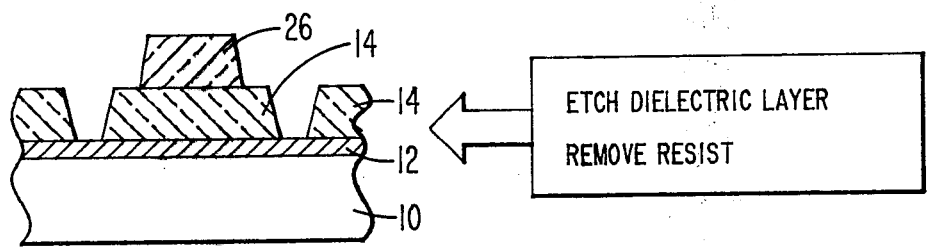

Utilizing the resist layer 28 as a mask, the first dielectric layer is etched down to the metal layer 12 as shown in FIG. 7. The remaining resist layer 28 is then removed. The structure shown in FIG. 7 has, on the surface of the metal layer 12, islands of dielectric material 14 and 14/26 of precise size and thickness and, therefore, of precise capacitance. The capacitance value of the islands is controlled in accordance with this invention by variation in the thickness of the dielectric layers 14 and 26. This precise control is of decided advantage in the manufacture of devices of the type described herein. For example, again referring to FIG. 7, the exposed portion of the metal layer 12 can be selectively etched to form a desired circuit pattern and a top electrode deposited over the resulting structure to form capacitors of varying value.

This invention has been described with reference to preferred embodiments thereof. It will be appreciated by those skilled in the art that various modifications may be made from the specific details without departing from the spirit and scope of the invention.

We claim:

1. A method for forming islands of dielectric material of varying thickness on a substrate comprising:
    (a) forming a first layer of dielectric material on the substrate;
    (b) depositing thereover a thin layer of etchable metal;
    (c) forming a patterned layer of resist material over the layer of etchable metal;
    (d) removing the exposed portion of the etchable metal layer;
    (e) depositing a second layer of dielectric material thereover, said layer contacting the first layer of dielectric layer in the openings in said metal layer;
    (f) forming a patterned layer of resist material over the second layer of dielectric material so that only said areas of contact are covered;
    (g) removing the exposed portion of the second dielectric layer and the remainder of the etchable metal layer;
    (h) forming a patterned layer of resist material over the remaining portion of the second dielectric layer and exposing a portion of the first dielectric layer;
    (i) removing the exposed portion of the first dielectric layer.

2. A method in accordance with claim 1, wherein the substrate is comprised of an electrically insulating material having thereon a layer of metal.

3. A method in accordance with claim 2, wherein said material is a polycrystalline material and said substrate contains a planarizing layer of dielectric material underlying the layer of metal.

4. A method in accordance with claim 3, wherein the polycrystalline material is beryllium oxide.

5. A method in accordance with claim 1, wherein both dielectric layers are comprised of the same material.

6. A method in accordance with claim 5, wherein said material is silicon nitride.

7. A method in accordance with claim 2, additionally including the steps of selectively etching said layer of metal on the substrate to form a circuit pattern and depositing a top electrode over the resulting structure.

8. A method in accordance with claim 1, wherein the thickness of one second dielectric layer is between 20 and 100 percent of the thickness of the first dielectric layer.

9. A method in accordance with claim 1, wherein a third layer of dielectric material is deposited on the substrate, said method additionally including repeating steps (b) through (e) after step (e) and repeating steps (f) and (g) after step (g).

10. A method in accordance with claim 9, wherein all dielectric layers are comprised of the same material.

* * * * *